United States Patent
Hase et al.

(10) Patent No.: US 9,966,639 B2
(45) Date of Patent: May 8, 2018

(54) BATTERY MONITORING DEVICE

(71) Applicant: KABUSHIKI KAISHA TOYOTA JIDOSHOKKI, Aichi (JP)

(72) Inventors: Ryusuke Hase, Kariya (JP); Takahiro Tsuzuku, Kariya (JP); Satoshi Yamamoto, Kariya (JP); Hiroaki Kato, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days. days.

(21) Appl. No.: 15/129,189

(22) PCT Filed: Apr. 2, 2015

(86) PCT No.: PCT/JP2015/060520
§ 371 (c)(1),
(2) Date: Sep. 26, 2016

(87) PCT Pub. No.: WO2015/156210
PCT Pub. Date: Oct. 15, 2015

(65) Prior Publication Data
US 2017/0117595 A1    Apr. 27, 2017

(30) Foreign Application Priority Data
Apr. 8, 2014  (JP) .................. 2014-079103

(51) Int. Cl.
H02J 7/00    (2006.01)
H02J 7/14    (2006.01)
(Continued)

(52) U.S. Cl.
CPC .......... H01M 10/482 (2013.01); G01R 31/36 (2013.01); H01M 2/34 (2013.01); H01M 10/425 (2013.01);
(Continued)

(58) Field of Classification Search
USPC ....... 320/150, 109, 116, 104, 139; 307/10.1, 307/149
See application file for complete search history.

(56) References Cited

U.S. PATENT DOCUMENTS 6,225,788 B1 * 5/2001 Kouzu .................. B60L 3/0046
320/150
6,411,063 B1 * 6/2002 Kouzu .................. B60L 3/0046
320/150
(Continued)

FOREIGN PATENT DOCUMENTS

| CN | 101800343 | 8/2010 |
|---|---|---|
| JP | 10-322916 | 12/1998 |

(Continued)

OTHER PUBLICATIONS

Written Opinion of the International Searching Authority in PCT/JP2015/060520, dated Jun. 23, 2015, along with a partial english translation thereof.

*Primary Examiner* — Alexis Pacheco
(74) *Attorney, Agent, or Firm* — Greenblum & Bernstein, P.L.C.

(57) ABSTRACT

A battery monitoring device is configured to include a monitoring unit that transmits state information that indicates a state of a battery and that interrupts, using an interrupter, a power supply from a battery to a load upon receiving a power-interruption request or when a power supply to the monitoring unit is interrupted, and a controller that transmits a power-interruption request to the monitoring unit upon determining, on the basis of the state information transmitted from the monitoring unit, that an anomaly has occurred in the battery, wherein the controller interrupts, using an interrupter, a power supply to the monitoring unit upon determining that a communication anomaly has (Continued)

occurred between the monitoring unit and the controller, or that an anomaly has occurred in the monitoring unit.

8 Claims, 5 Drawing Sheets

(51) Int. Cl.
    *H01M 10/48*    (2006.01)
    *H01M 2/34*     (2006.01)
    *G01R 31/36*    (2006.01)
    *H01M 10/42*    (2006.01)

(52) U.S. Cl.
    CPC .......... *H02J 7/0029* (2013.01); *H02J 7/0031* (2013.01); *H01M 2010/4278* (2013.01); *H01M 2200/00* (2013.01); *H02J 7/0021* (2013.01)

(56) References Cited

U.S. PATENT DOCUMENTS

| 2002/0186576 | A1* | 12/2002 | Kanouda | H02J 9/061 |
| | | | | 363/125 |
| 2010/0194340 | A1 | 8/2010 | Lim | |
| 2010/0301868 | A1 | 12/2010 | Ishikawa et al. | |
| 2012/0098489 | A1* | 4/2012 | Arai | B60L 3/0046 |
| | | | | 320/109 |
| 2017/0125999 | A1* | 5/2017 | Yamamoto | H02H 7/18 |

FOREIGN PATENT DOCUMENTS

| JP | 2003-9403 | 1/2003 |
| JP | 2003-291754 | 10/2003 |
| JP | 2010-183829 | 8/2010 |
| JP | 2010-279146 | 12/2010 |
| JP | 2013-102657 | 5/2013 |

* cited by examiner

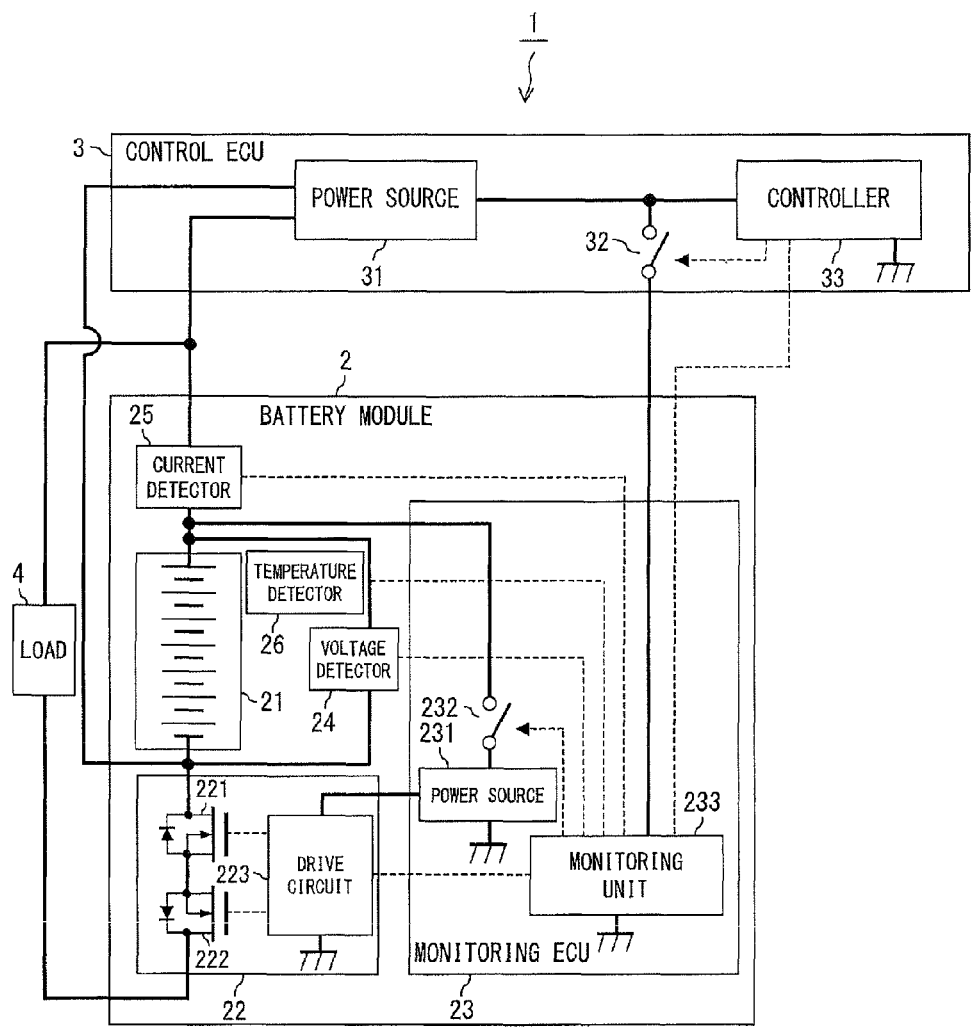
F I G. 1

BATTERY MONITORING DEVICE

TECHNICAL FIELD

The present invention relates to a battery monitoring device that monitors a state of a battery.

RELATED ART

There exists a battery monitoring device that monitors a state of a battery (such as overcharging or overdischarging) that is used in a vehicle, as disclosed in, for example, Patent Document 1.

There also exists a battery monitoring device in which, for example, when the controller determines, on the basis of state information indicating a state of a battery that is transmitted from a monitoring unit, that an anomaly has occurred in the battery, a power-interruption request is transmitted from the controller to the monitoring unit so as to interrupt a power supply from the battery to a load.

CITATION LIST

Patent Document

Patent Document 1: Japanese Laid-open Patent Publication No. 2013-102657

SUMMARY OF INVENTION

Technical Problem

However, in the battery monitoring devices described above, there occurs a problem in which it is not possible to interrupt a power supply from a battery to a load when there occurs a communication anomaly between a monitoring unit and a controller, which prevents a transmission and reception of state information or a power-interruption request, or when there occurs an anomaly in the monitoring unit.

Thus, an object of the present invention is to interrupt a power supply to a monitoring unit in a battery monitoring device so as to interrupt a power supply from a battery to a load even if there occurs a communication anomaly between a monitoring unit and a controller, or even if there occurs an anomaly in the monitoring unit.

Means for Solving the Problems

A battery monitoring device according to embodiments includes first and second interrupters, a monitoring unit, and a controller.

The monitoring unit transmits state information that indicates a state of a battery. Further, when the monitoring unit receives a power-interruption request, or when a power supply to the monitoring unit is interrupted, the monitoring unit interrupts a power supply from the battery to a load using the first interrupter.

When it determines, on the basis of the state information transmitted from the monitoring unit, that an anomaly has occurred in the battery, the controller transmits a power-interruption request to the monitoring unit. Further, when it determines that a communication anomaly has occurred between the monitoring unit and the controller, or that an anomaly has occurred in the monitoring unit, the controller interrupts a power supply to the monitoring unit using the second interrupter.

This makes it possible to interrupt a power supply from the battery to the load even if there occurs a communication anomaly between the monitoring unit and the controller, or even if there occurs an anomaly in the monitoring unit.

Advantageous Effects of Invention

According to the present invention, in a battery monitoring device in which, when a controller determines, on the basis of state information transmitted from a monitoring unit, that an anomaly has occurred in a battery, a power-interruption request is transmitted from the controller to the monitoring unit so as to interrupt a power supply from the battery to a load, a power supply from the battery to the load can be interrupted even if there occurs a communication anomaly between the monitoring unit and the controller, or even if there occurs an anomaly in the monitoring unit.

BRIEF DESCRIPTION OF DRAWINGS

FIG. 1 illustrates an example of a battery pack;

DESCRIPTION OF EMBODIMENTS

Figure 2:
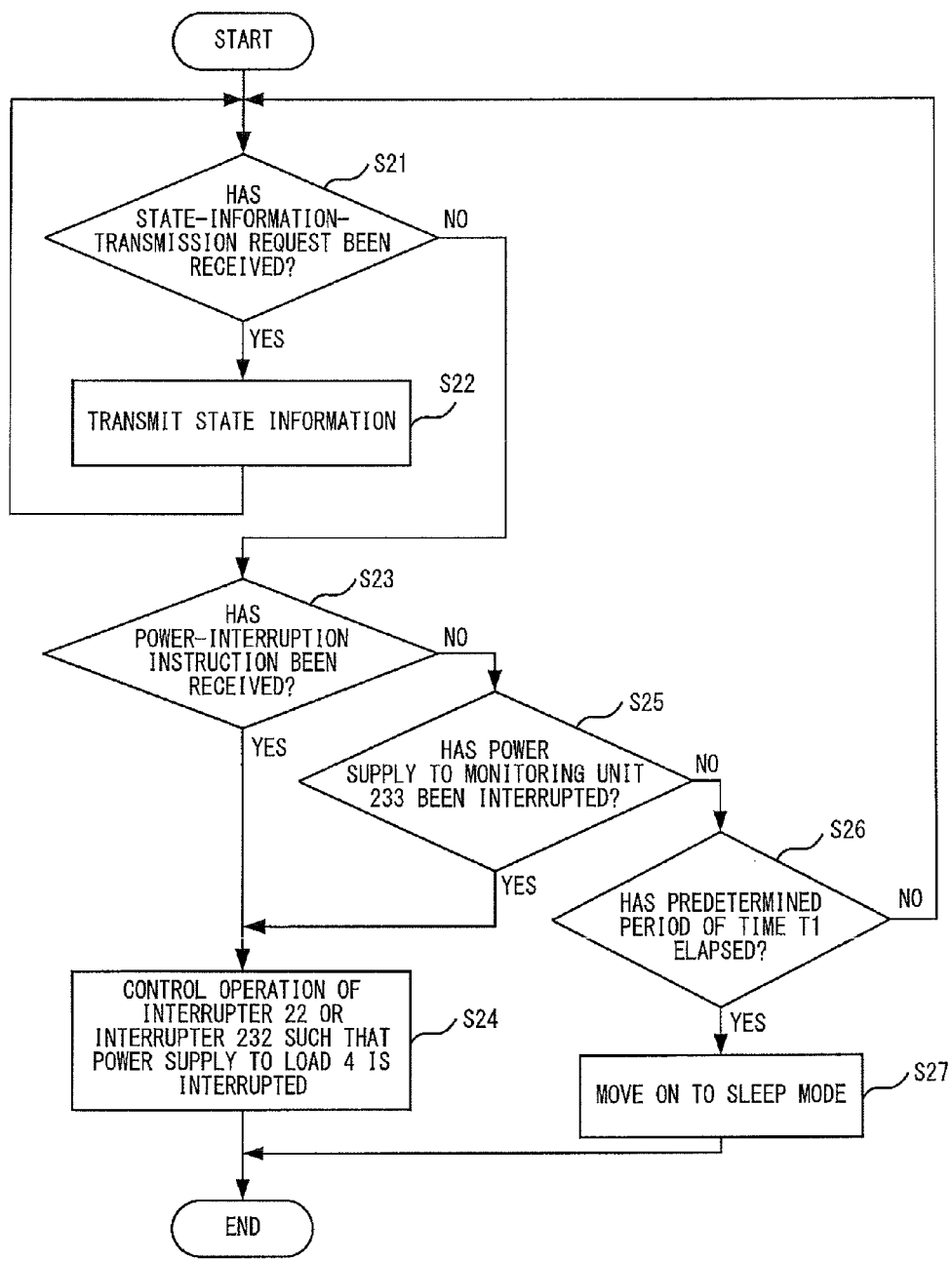
FIG. 2 is a flowchart that illustrates an example of an operation of a monitoring unit.

FIG. 1 illustrates an example of a battery pack.

For example, a battery pack 1 illustrated in FIG. 1 is provided in a vehicle (such as an electric forklift, a hybrid vehicle, and an electric vehicle), and includes a battery module 2 and a control ECU (electronic control unit) 3.

The battery module 2 includes a battery 21, an interrupter 22 (a first interrupter), a monitoring ECU 23, a voltage detector 24, a current detector 25, and a temperature detector 26.

The battery 21 is configured to include seven batteries (such as a lithium-ion secondary battery and a nickel-metal hydride battery) that are series-connected to one another. The number of batteries that constitute the battery 21 is not limited to seven.

The interrupter 22 includes MOSFETs (metal oxide semiconductor field effect transistor) 221 and 222 of an N channel, and a drive circuit 223 that controls operations of the MOSFETs 221 and 222. In other words, a drain terminal of the MOSFET 221 is connected to a negative terminal of the battery 21, a source terminal of the MOSFET 221 is connected to a source terminal of the MOSFET 222, and a drain terminal of the MOSFET 222 is connected to a load 4 (such as a motor for driving a vehicle). When the MOSFETs 221 and 222 are turned on, power is supplied from the battery 21 to the load 4, and when the MOSFETs 221 and 222 are turned off, a power supply from the battery 21 to the load 4 is interrupted. The MOSFETs 221 and 222 may be replaced with other transistors such as a bipolar transistor or mechanical relays. The interrupter 22 may be provided between a positive terminal of the battery 21 and the load 4. When a power supply to the drive circuit 223 is interrupted, a low-level signal is input to a gate terminal of each of the MOSFETs 221 and 222, the MOSFETs 221 and 222 are turned off, and then a power supply from the battery 21 to the load 4 is interrupted. In other words, the interrupter 22 interrupts a power supply from the battery 21 to the load 4 when a power supply to the interrupter 22 is interrupted.

The voltage detector 24 is constituted of, for example, a voltmeter, and it detects a voltage in the battery 21 and transmits the detected voltage to a monitoring unit 233 that will be described later.

The current detector 25 is constituted of, for example, an ammeter, and it detects current that flows through the battery 21 and transmits the detected current to the monitoring unit 233.

The temperature detector 26 is constituted of, for example, a thermistor, and it detects a temperature in the battery 21 and transmits the detected temperature to the monitoring unit 233.

The monitoring ECU 23 includes a power source 231, an interrupter 232 (a third interrupter), and the monitoring unit 233.

The power source 231 is constituted of, for example, a DC/DC converter, and supplies power to the drive circuit 223 of the interrupter 22 using power supplied from the battery 21.

The interrupter 232 is constituted of, for example, a transistor or a mechanical relay, and is provided between the battery 21 and the power source 231. Further, the interrupter 232 electrically connects/disconnects the battery 21 to/from the power source 231. When the battery 21 is electrically connected by the interrupter 232 to the power source 231, power is supplied to the drive circuit 223, and when the battery 21 is electrically disconnected by the interrupter 232 from the power source 231, a power supply to the drive circuit 223 is interrupted. The interrupter 232 may be provided between the power source 231 and the drive circuit 223.

The monitoring unit 233 is constituted of, for example, a CPU (central processing unit), a multicore CPU, or a programmable device (such as an FPGA (field programmable gate array) and a PLD (programmable logic device)). For example, when it receives a state-information-transmission request transmitted from the control ECU 3, the monitoring unit 233 transmits, to the control ECU 3, the voltage transmitted from the voltage detector 24, the current transmitted from the current detector 25, and the temperature transmitted from the temperature detector 26 as state information that indicates a state of the battery 21. For example, when it receives a power-interruption instruction transmitted from the control ECU 3, the monitoring unit 233 interrupts a power supply from the battery 21 to the load 4 using the interrupter 22 or the interrupter 232. The monitoring unit 233 of FIG. 1 is configured to be driven with power supplied from the battery 21 through the control ECU 3, but it may be configured to be driven with power supplied by a battery or a power source that is other than the battery 21.

The control ECU 3 includes a power source 31, an interrupter 32 (a second interrupter), and a controller 33.

The power source 31 is constituted of, for example, a DC/DC converter, and supplies, using power supplied from the battery 21, power to the controller 33, and to the monitoring unit 233 through the interrupter 32.

The interrupter 32 is constituted of, for example, a transistor or a mechanical relay, and is provided between the power source 31 and the monitoring unit 233. Further, the interrupter 32 electrically connects/disconnects the power source 31 to/from the monitoring unit 233. When the power source 31 is electrically connected by the interrupter 32 to the monitoring unit 233, power is supplied to the monitoring unit 233, and when the power source 31 is electrically disconnected by the interrupter 32 from the monitoring unit 233, a power supply to the monitoring unit 233 is interrupted.

The controller 33 is constituted of, for example, a CPU, a multicore CPU, or a programmable device. For example, the controller 33 transmits a state-information-transmission request to the monitoring unit 233 every time a predetermined period of time elapses. For example, when it determines that an anomaly has occurred in the battery 21, the controller 33 transmits a power-interruption instruction to the monitoring unit 233. For example, when the controller 33 determines that a communication anomaly has occurred between the monitoring unit 233 and the controller 33, or that an anomaly has occurred in the monitoring unit 233, the controller 33 interrupts a power supply to the monitoring unit 233 using the interrupter 32. For example, when the controller 33 is started according to an instruction from, for example, a user, the controller 33 starts the monitoring unit 233.

A battery monitoring device according to an embodiment is configured to include, for example, the interrupter 22, the interrupter 32, the monitoring unit 233, and the controller 33.

FIG. 2 is a flowchart that illustrates an example of an operation of the monitoring unit 233 in the battery monitoring device according to the embodiment.

When the monitoring unit 233 receives a state-information-transmission request transmitted from the controller 33 during a period from when the monitoring unit 233 starts or receives a last state-information-transmission request to when a predetermined period of time T1 elapses (S21: Yes), the monitoring unit 233 transmits state information to the controller 33 (S22).

Next, when the monitoring unit 233 receives a power-interruption instruction transmitted from the controller 33 during a period from when the monitoring unit 233 starts or receives the last state-information-transmission request to when the predetermined period of time T1 elapses (S21: No, S23: Yes), the monitoring unit 233 controls an operation of the interrupter 22 or the interrupter 232 such that a power supply from the battery 21 to the load 4 is interrupted (S24).

Further, when a power supply to the monitoring unit 233 is interrupted during a period from when the monitoring unit 233 starts or receives the last state-information-transmission request to when the predetermined period of time T1 elapses (S21: No, S23: No, S25: Yes), the monitoring unit 233 controls the operation of the interrupter 22 or the interrupter 232 such that a power supply from the battery 21 to the load 4 is interrupted (S24).

For example, when the monitoring unit 233 receives the power-interruption instruction, or when a power supply to the monitoring unit 233 is interrupted, the monitoring unit 233 outputs a low level signal to the gate terminal of each of the MOSFETs 221 and 222 through the drive circuit 223. For example, when the monitoring unit 233 receives the power-interruption instruction, or when a power supply to the monitoring unit 233 is interrupted, the monitoring unit 233 controls the operation of the interrupter 232 such that the battery 21 is electrically disconnected from the power source 231, so as to interrupt a power supply from the power source 231 to the drive circuit 223 and to output a low level signal to the gate terminal of each of the MOSFETs 221 and 222. This permits the MOSFETs 221 and 222 to be turned off and permits a power supply from the battery 21 to the load 4 to be interrupted.

When the monitoring unit 233 determines that the predetermined period of time T1 has elapsed since the monitoring unit 233 was started or since it received the last state-information-transmission request without having received the state-information-transmission request or the power-interruption instruction or without any interruption of a power supply to the monitoring unit 233, that is, when the monitoring unit 233 determines that a communication anomaly has occurred between the monitoring unit 233 and the controller 33 (S21: No, S23: No, S25: No, S26: Yes), the monitoring unit 233 moves on to a sleep mode (S27). For example, when it moves on to a sleep mode, the monitoring unit 233 stops some of the functions of all of the functions included in itself (such as a function other than a communication function). This permits a reduction of a power consumption in the battery 21. When it moves on to a sleep mode while writing data to a storage such as a flash memory, the monitoring unit 233 moves on to a sleep mode after data writing processing is completed so as to not corrupt the data by terminating the data writing processing halfway. Further, when there does not occur an anomaly in the battery 21 and when there does not occur a communication anomaly between the monitoring unit 233 and the controller 33, the monitoring unit 233 repeatedly receives a state-information-transmission request and transmits state information (S21 and S22).

Figure 3:
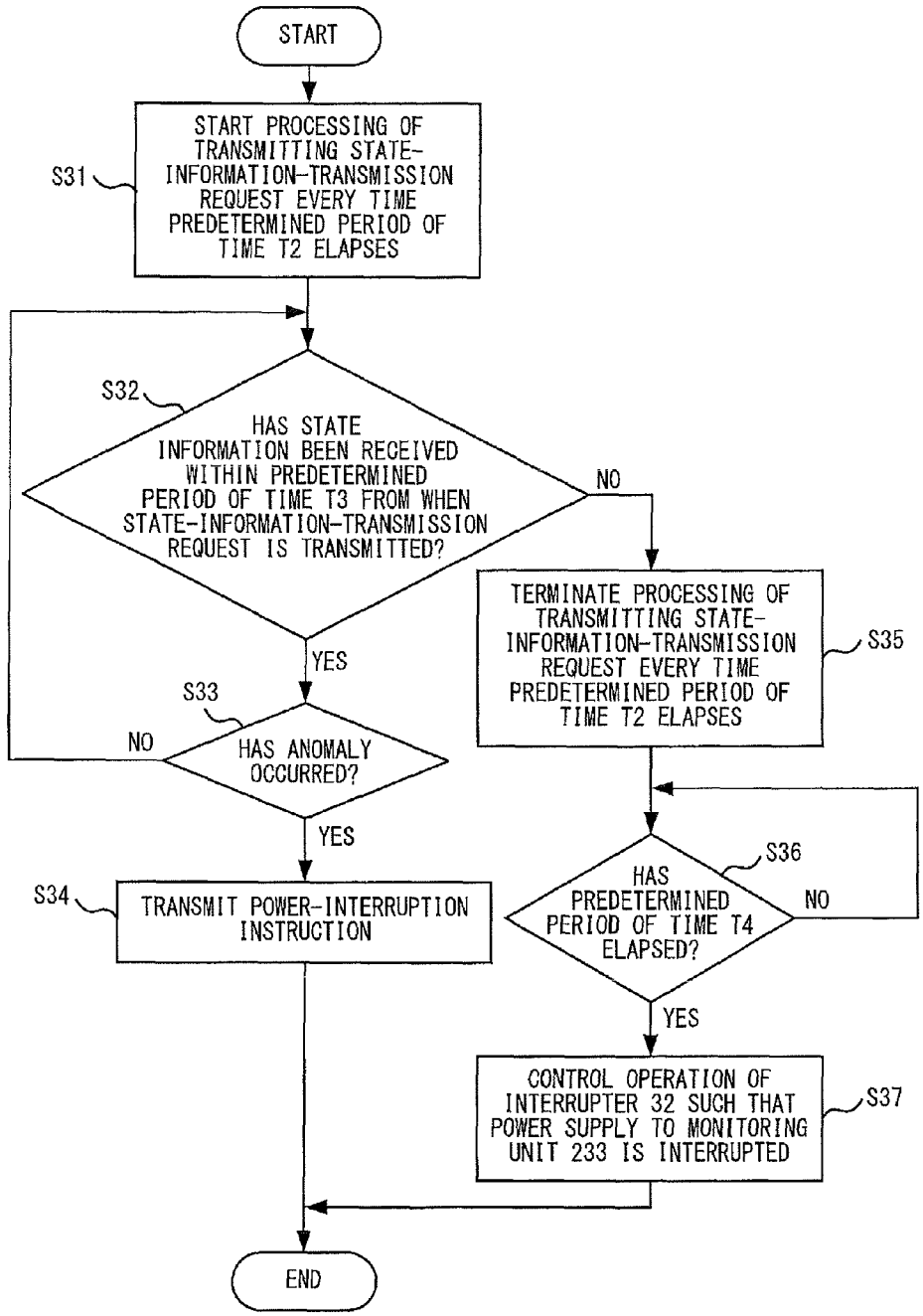
FIG. 3 is a flowchart that illustrates an example of an operation of a controller.

FIG. 3 is a flowchart that illustrates an example of an operation of the controller 33 in the battery monitoring device according to the embodiment.

First, when it is started, the controller 33 starts regular-communication processing of transmitting a state-information-transmission request every time a predetermined period of time T2 elapses (S31).

Next, when the controller 33 receives state information during a period from when it transmits a state-information-transmission request to when a predetermined period of time T3 the predetermined period of time T2) elapses (S32: Yes), the controller 33 determines whether an anomaly has occurred in the battery 21 using the state information (S33).

When it determines that an anomaly has occurred in the battery 21 (S33: Yes), the controller 33 transmits a power-interruption instruction to the monitoring unit 233 (S34), and when it determines that an anomaly has not occurred in the battery 21 (S33: No), the controller 33 determines again whether it has received state information during a period from when it transmits the state-information-transmission request to when the predetermined period of time T3 elapses (S32). For example, when at least one of a voltage, a current, and a temperature that are indicated by the state information is not less than a threshold, the controller 33 determines that an anomaly has occurred in the battery 21, and when the voltage, the current, and the temperature that are indicated by the state information are all less than the threshold, the controller 33 determines that an anomaly has not occurred in the battery 21.

Further, when the controller 33 determines that it has not received state information during a period from when it transmits the state-information-transmission request to when the predetermined period of time T3 elapses, that is, when the controller 33 determines that a communication anomaly has occurred between the monitoring unit 233 and the controller 33 (S32: No), the controller 33 controls an operation of the interrupter 32 (S37) after a predetermined period of time T4 has elapsed (S36: Yes) since the above-described regular-communication processing has been terminated (S35), such that a power supply to the monitoring unit 233 is interrupted. A communication anomaly may occur between the monitoring unit 233 and the controller 33 due to, for example, breaking or short circuiting of a communication line between the monitoring unit 233 and the controller 33 or due to a failure in a communication function of the monitoring unit 233.

In other words, when it receives the state-information-transmission request regularly transmitted from the controller 33, the monitoring unit 233 transmits state information to the controller 33, and when it does not receive the state-information-transmission request regularly transmitted from the controller 33, the monitoring unit 233 moves on to a sleep mode.

Further, when the monitoring unit 233 receives the power-interruption instruction or when a power supply to the monitoring unit 233 is interrupted, the monitoring unit 233 interrupts a power supply from the battery 21 to the load 4 using the interrupter 22 or the interrupter 232.

When the controller 33 determines that a communication anomaly has occurred between the monitoring unit 233 and the controller 33, the controller 33 interrupts, using the interrupter 32, a power supply to the monitoring unit 233 after the predetermined period of time T4 has elapsed since it terminates processing of regularly transmitting a state-information-transmission request.

The predetermined period of time T4 is set to a time that is not less than the time needed during a period from when the processing of regularly transmitting a state-information-transmission request is terminated in the controller 33 to when the movement on to a sleep mode is completed in the monitoring unit 233. Accordingly, when a power supply to the monitoring unit 233 is interrupted after the predetermined period of time T4 has elapsed, a power supply to the monitoring unit 233 is interrupted when the movement on to a sleep mode is completed. Thus, even if a communication anomaly has occurred between the monitoring unit 233 and the controller 33 while writing data to the storage in the monitoring unit 233, it is possible to prevent the data writing processing from being terminated halfway, which results in prevention from corrupting of the data.

In the flowchart of FIG. 3, the process of S35 may be omitted. In other words, when the controller 33 determines that a communication anomaly has occurred between the monitoring unit 233 and the controller 33 (S32: No), the controller 33 controls the operation of the interrupter 32 (S37) after the predetermined period of time T4 has elapsed (S36: Yes) without terminating the processing of regularly transmitting a state-information-transmission request, such that a power supply to the monitoring unit 233 is interrupted.

Further, in the flowchart of FIG. 3, the processes of S35 and S36 may be omitted. In other words, when the controller 33 determines that a communication anomaly has occurred between the monitoring unit 233 and the controller 33 (S32: No), the controller 33 controls the operation of the interrupter 32 (S37) without terminating the processing of regularly transmitting a state-information-transmission request and without waiting for the predetermined period of time T4 to elapse, such that a power supply to the monitoring unit 233 is interrupted.

Figure 4:
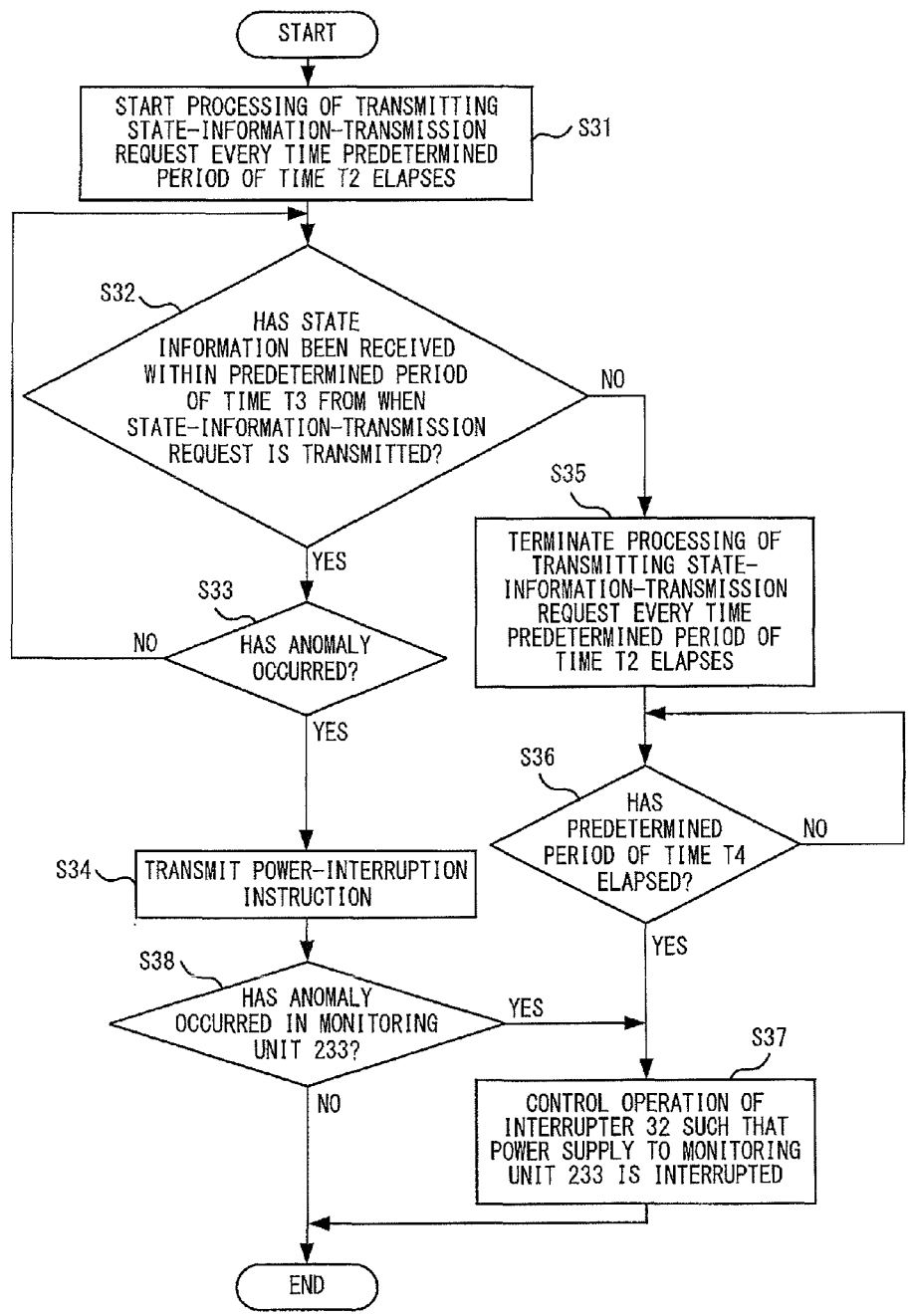
FIG. 4 is a flowchart that illustrates another example of the operation of the controller.

Moreover, as illustrated in the flowchart of FIG. 4, when the controller 33 may determine that an anomaly has occurred in the battery 21 (S33: Yes), transmit the power-interruption instruction to the monitoring unit 233 (S34), determine that a power supply from the battery 21 to the load 4 has been interrupted so as to determine that an anomaly has occurred in the monitoring unit 233 (S38: Yes), and move on to the process of S37 to control the operation of the interrupter 32 such that a power supply to the monitoring unit 233 is interrupted. For example, when current (a current that flows through the battery 21) indicated in state information transmitted from the monitoring unit 233 is not less than the threshold after the controller 33 transmits the power-interruption instruction to the monitoring unit 233, the controller 33 determines that a power supply from the battery 21 to the load 4 has not been interrupted. An anomaly may occur in the monitoring unit 233 due to, for example, breaking or short circuiting of a signal line between the monitoring unit 233 and the interrupter 22 or a signal line between the monitoring unit 233 and the interrupter 232, or due to a failure in a function that controls the operations of the interrupter 22 and the interrupter 232 in the monitoring unit 233. S31 to S37 in the flowchart of FIG. 4 are similar to S31 to S37 in the flowchart of FIG. 3.

The anomaly that may occur in the embodiment may be a communication anomaly that occurs between the monitoring unit 233 and the controller 33 (that is, an anomaly in which the state-information-transmission request or the power-interruption instruction does not arrive at the monitoring unit 233 from the controller 33, or an anomaly in which the controller 33 is not able to confirm whether the monitoring unit 233 has performed processing corresponding to the state-information-transmission request or the power-interruption instruction), or an anomaly that occurs in the monitoring unit 233 (that is, an anomaly in which the monitoring unit 233 is not able to perform processing corresponding to the state-information-transmission request or the power-interruption instruction even if the request or the instruction arrives at the monitoring unit 233 from the controller 33).

As described above, in the battery monitoring device according to the embodiment, when it determines that a communication anomaly has occurred between the monitoring unit 233 and the controller 33, or that an anomaly has occurred in the monitoring unit 233, the controller 33 interrupts a power supply to the monitoring unit 233 using the interrupter 32. Further, when a power supply to the monitoring unit 233 is interrupted, the MOSFETs 221 and 222 are turned off. This permits a power supply from the battery 21 to the load 4 to be interrupted even if a communication anomaly occurs between the monitoring unit 233 and the controller 33, or even if an anomaly occurs in the monitoring unit 233.

Further, in the battery monitoring device according to the embodiment, when the controller 33 determines that a communication anomaly has occurred between the monitoring unit 233 and the controller 33, the controller 33 interrupts, using the interrupter 32, a power supply to the monitoring unit 233 after the predetermined period of time T4 has elapsed since it terminates the processing of regularly transmitting a state-information-transmission request. This permits a state-information-transmission request to be transmitted from the controller 33 to the monitoring unit 233, and it is possible to prevent a power supply to the monitoring unit 233 from being interrupted until the movement on to a sleep mode is completed in the monitoring unit 233 even if there occurs a communication anomaly in which state information is not transmitted from the monitoring unit 233 to the controller 33, which results in preventing data from being corrupted without interrupting a power supply to the monitoring unit 233 while performing data writing.

Furthermore, in the battery monitoring device according to the embodiment, when a power supply to the monitoring unit 233 is interrupted, the monitoring unit 233 interrupts a power supply to the interrupter 22 using the interrupter 232. When a power supply to the interrupter 22 is interrupted, the interrupter 22 interrupts a power supply from the battery 21 to the load 4. This permits a power supply from the battery 21 to the load 4 from being interrupted even if there occurs a failure in the drive circuit 223 of the interrupter 22, or even if a signal line between the monitoring unit 233 and the interrupter 22 is broken or short circuited.

Figure 5:
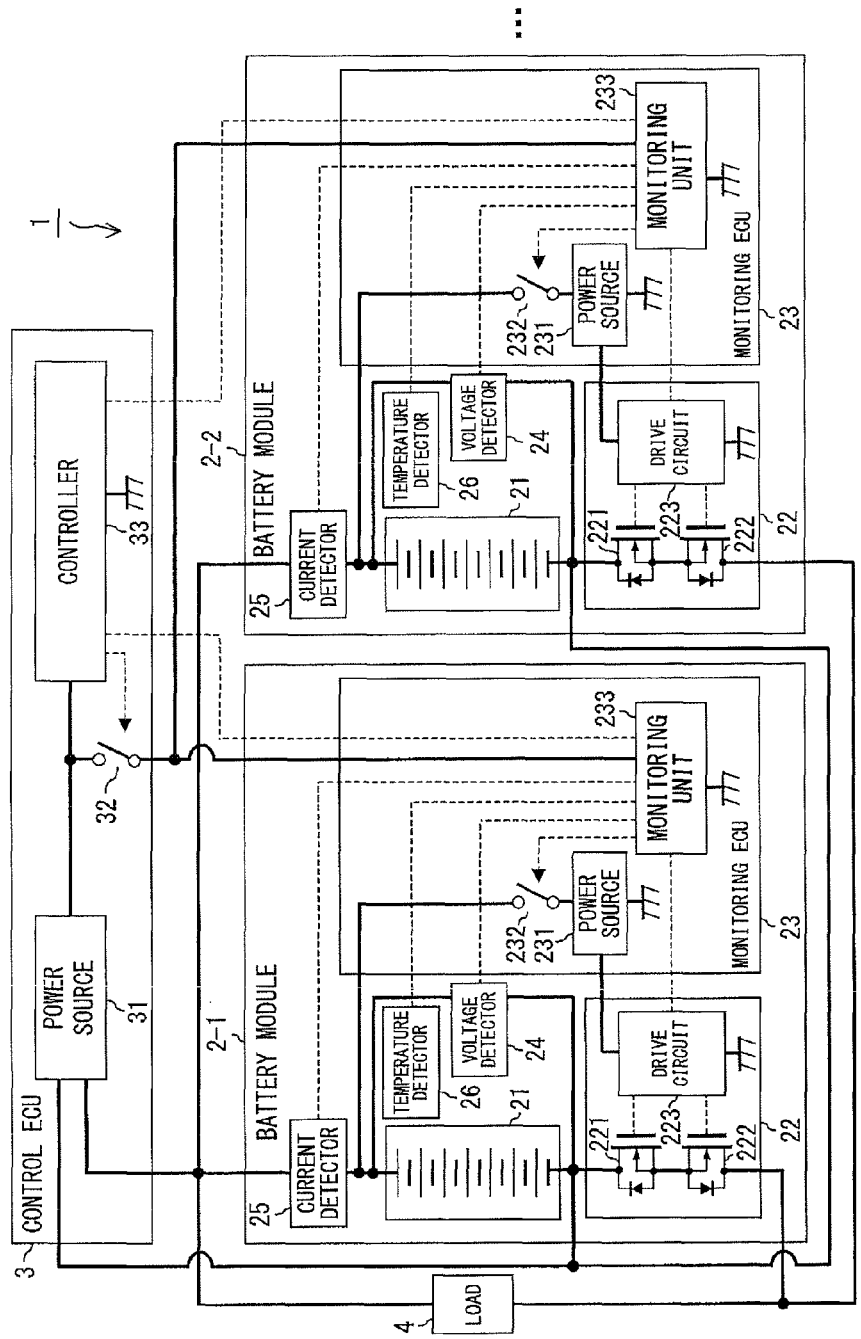
FIG. 5 illustrates another example of the battery pack.

Moreover, in the above-described battery monitoring device according to the embodiment, the battery pack 1 is configured to include one battery module 2, but, for example, it may be configured to include a plurality of battery modules 2 (2-1, 2-2, . . . ), as illustrated in FIG. 5. In such a configuration, batteries 21 may be connected in parallel to one another. Power terminals of the monitoring units 233 of the respective battery modules 2 are connected to one another, and the interrupter 32 is provided between the connection point and the power source 31. When the controller 33 determines, on the basis of state information transmitted from the monitoring unit 233 of each of the battery modules 2, that an anomaly has occurred in at least one of the batteries 21 in the respective battery modules 2, the controller 33 transmits a power-interruption signal to the monitoring unit 233 of the corresponding battery module 2.

REFERENCE SIGNS LIST 1 battery pack
2 battery module
3 control ECU
4 load
21 battery
22,232,32 interrupter
23 monitoring ECU
24 voltage detector
25 current detector
26 temperature detector
221,222 MOSFET
223 drive circuit
231 power source
233 monitoring unit
31 power source
33 controller

The invention claimed is:
1. A battery monitoring device comprising:
a battery module that includes:
  a battery;
  a first interrupter connected between the battery and a load and configured to electrically connect/disconnect the battery and the load to/from each other; and
  a monitoring unit configured to control the first interrupter; and
a control electronic control unit (ECU) that includes:
  a power source configured to supply power to the monitoring unit;
  a second interrupter connected between the power source and the monitoring unit and configured to electrically connect/disconnect the power source and the monitoring unit to/from each other; and
  a controller configured to control the second interrupter, wherein
the monitoring unit:
  is driven by power supplied from the power source through the second interrupter;
  transmits state information that indicates a state of the battery;
  performs control to disconnect the first interrupter and interrupts a power supply from the battery to the load upon receiving a power-interruption request transmitted from the controller or when a power supply to the monitoring unit is interrupted; and the controller:
transmits, to the monitoring unit, the power-interruption request that instructs the monitoring unit to interrupt the first interrupter, upon determining, on a basis of the state information that is transmitted from the monitoring unit, that an anomaly has occurred in the battery, and when determining that a communication anomaly has occurred between the monitoring unit and the controller, or that an anomaly has occurred in the monitoring unit, performs control to disconnect the second interrupter and interrupts the power supply from the power source to the monitoring unit.

2. The battery monitoring device according to claim 1, wherein
when the controller determines that a communication anomaly has occurred between the monitoring unit and the controller, the controller interrupts, using the second interrupter, the power supply to the monitoring unit after a predetermined period of time has elapsed.

3. The battery monitoring device according to claim 2, wherein
the monitoring unit transmits the state information to the controller when the monitoring unit receives a state-information-transmission request regularly transmitted from the controller, and moves on to a sleep mode when the monitoring unit does not receive a state-information-transmission request regularly transmitted from the controller, and when the controller determines that a communication anomaly has occurred between the monitoring unit and the controller, the controller interrupts, using the second interrupter, the power supply to the monitoring unit after the predetermined period of time has elapsed since the controller terminates processing of regularly transmitting the state-information-transmission request.

4. A battery monitoring device comprising:
first and second interrupters;
a monitoring unit configured to transmit state information that indicates a state of a battery and to interrupt, using the first interrupter, a power supply from the battery to a load upon receiving a power-interruption request or when a power supply to the monitoring unit is interrupted;
a controller configured to transmit a power-interruption request to the monitoring unit upon determining, on a basis of the state information that is transmitted from the monitoring unit, that an anomaly has occurred in the battery, wherein
when the controller determines that a communication anomaly has occurred between the monitoring unit and the controller, or that an anomaly has occurred in the monitoring unit, the controller interrupts the power supply to the monitoring unit using the second interrupter; and
a third interrupter, wherein
when the power supply to the monitoring unit is interrupted, the monitoring unit interrupts a power supply to the first interrupter using the third interrupter, and
when a power supply to the first interrupter is interrupted, the first interrupter interrupts the power supply from the battery to the load.

5. The battery monitoring device according to claim 2, comprising:
a third interrupter, wherein
when the power supply to the monitoring unit is interrupted, the monitoring unit interrupts a power supply to the first interrupter using the third interrupter, and
when a power supply to the first interrupter is interrupted, the first interrupter interrupts the power supply from the battery to the load.

6. The battery monitoring device according to claim 3, comprising:
a third interrupter, wherein
when the power supply to the monitoring unit is interrupted, the monitoring unit interrupts a power supply to the first interrupter using the third interrupter, and
when a power supply to the first interrupter is interrupted, the first interrupter interrupts the power supply from the battery to the load.

7. The battery monitoring device according to claim 1, wherein
the controller regularly transmits a state-information-transmission request to the monitoring unit, and terminates the processing of transmitting the state-information-transmission request when the controller determines that the state information has not been received for a first time period since transmission of the state-information-transmission request,
the monitoring unit moves on to a sleep mode when the monitoring unit does not receive the state-information-transmission request regularly transmitted from the controller, the sleep mode being a mode in which some of all functions included in the monitoring unit are stopped,
the controller interrupts, using the second interrupter, a power supply from the power source to the monitoring unit after a second time period has elapsed since the termination of the processing of transmitting the state-information-transmission request, and
the second time period is equal to or longer than a period of time required for the monitoring unit to move on to the sleep mode after the controller has terminated the processing of transmitting the state-information-transmission request.

8. The battery monitoring device according to claim 1, wherein
when a current value indicated by the state information transmitted from the monitoring unit is equal to or higher than a threshold after the controller has transmitted the power-interruption request to the monitoring unit, the controller interrupts, using the second interrupter, a power supply from the power source to the monitoring unit.

* * * * *